United States Patent
Divakaruni et al.

(10) Patent No.: US 6,670,667 B2
(45) Date of Patent: Dec. 30, 2003

(54) ASYMMETRIC GATES FOR HIGH DENSITY DRAM

(75) Inventors: Ramachandra Divakaruni, Somers, NY (US); Wayne Ellis, Jericho, VT (US); Jack Mandelman, Stormville, NY (US); Mary Weybright, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/213,061

(22) Filed: Aug. 6, 2002

(65) Prior Publication Data

US 2002/0192912 A1 Dec. 19, 2002

Related U.S. Application Data

(62) Division of application No. 09/608,019, filed on Jun. 30, 2000, now Pat. No. 6,458,646.

(51) Int. Cl.[7] .............................................. H01L 27/108
(52) U.S. Cl. ........................................ 257/302; 438/241
(58) Field of Search ................................ 257/261, 286, 257/314–315, 296, 302, 326; 438/241–243, 142, 159

(56) References Cited

U.S. PATENT DOCUMENTS

| | | | |
|---|---|---|---|
| 5,262,352 A | 11/1993 | Woo et al. | |
| 5,308,782 A | 5/1994 | Mazure et al. | |
| 5,340,754 A | 8/1994 | Witek et al. | |
| 5,568,418 A | * 10/1996 | Crisenza et al. | ........ 365/185.01 |
| 6,018,178 A | 1/2000 | Sung | |
| 6,163,059 A | * 12/2000 | Hause et al. | ................ 257/408 |
| 6,277,683 B1 | 8/2001 | Pradeep et al. | |
| 6,326,260 B1 | * 12/2001 | Divakaruni et al. | ........ 438/241 |
| 6,352,934 B1 | 3/2002 | Lee | |
| 6,372,559 B1 | 4/2002 | Crowder et al. | |
| 6,403,423 B1 | 6/2002 | Weybright et al. | |

* cited by examiner

Primary Examiner—David Nelms
Assistant Examiner—David Vu
(74) Attorney, Agent, or Firm—Scully, Scott, Murphy & Presser; Joseph P. Abate

(57) ABSTRACT

A memory device structure including an array device region having one or more asymmetric gates formed therein, wherein each asymmetric gate comprises a first edge having a substantially vertical sidewall and a second edge having a polysilicon step segment, and a support device region including one or more patterned gate conductors formed therein, wherein each patterned gate conductor in the support device region includes edges having substantially vertical sidewalls. The structure may further include a circuit device region located between the array device region and the support device region, said core device region including one or more patterned gates, each gate including a polysilicon step segment on each side of the gate.

13 Claims, 3 Drawing Sheets

ASYMMETRIC GATES FOR HIGH DENSITY DRAM

RELATED APPLICATIONS

This application is a divisional application of U.S. application Ser. No. 09/608,019, filed on Jun. 30, 2000 now U.S. Pat. No. 6,458,646.

FIELD OF THE INVENTION

The present invention relates to semiconductor integrated circuit (IC) manufacturing and, more particularly to a method of forming an asymmetric field effect transistor (FET) gate electrode for a memory structure such as a dynamic random access memory (DRAM) structure.

BACKGROUND OF THE INVENTION

In the field of semiconductor device manufacturing, merged logic DRAM devices are becoming increasingly important. This is so since the coupling of logic devices with DRAM cells provides a device which has all the benefits of DRAMs, but having the speed of conventional logic devices to improve bandwidth and performance.

In such applications, the channel length of the DRAM transfer gate devices continues to shrink aggressively. Conventional scaling techniques are limited in their applicability for low leakage DRAM transfer devices. There is thus a need for novel integration schemes with only limited shrinking of the channel length.

As the DRAM cell size decreases, the transfer gate has consequently shrunk with it. Earlier cell sizes (>$8F^2$) allow for wiggled gates to keep the array transistor off leakage to a minimum. With the onset of $8F^2$ cells with equal lines and spaces at minimum feature size, F, in the wordline direction, there is need to provide larger transfer gate lengths of the array pass transistor by non-lithographic techniques. Conventional scaling techniques use shallow junctions (limited by surface leakage and charge writeback characteristics), high channel doping concentrations or halo implants which increase leakage and are thus not easy to incorporate in DRAM processing.

One known process is based on the BEST (BuriEd Strap) cell modified for $8F^2$. Once the trench capacitor and shallow trench isolation are formed, the gate conductor stack is put down. Typically, the gate conductor stack consists of polysilicon and $WSi_x$ capped with SiN. During the gate mask opening step, the SiN is patterned and the etch typically stops in the $WSi_x$, the resist is stripped and the remaining gate conductor stack is etched with the SiN as a hard mask. Post gate sidewall oxidation, the SiN spacers are formed, followed by a barrier SiN film and boron phosphorus silicate glass (BPSG) deposition, densification and planarization. A TEOS (tetraethylorthosilicate) layer is formed for the damascene bitlines and the bitline contacts are etched borderless to the gates prior to forming the bitline wiring layer (generally tungsten).

Additionally, it is known that the present processing of DRAM structures in the array portion of the device directly links the lithographic dimension to the polysilicon linewidth. Hence, if there is resist webbing, the increase in the polysilicon linewidth is limited, which directly affects the retention of the DRAM cell.

The present invention is thus directed to further improvements in gate conductor processing which can be easily incorporated into existing DRAM processing techniques.

SUMMARY OF THE INVENTION

One object of the present invention is to provide a method of manufacturing a gate conductor of a memory device wherein the gate polysilicon can be tailored so as to improve the retention of the DRAM.

Another object of the present invention is to provide a method of manufacturing a gate conductor of a memory device wherein the length of the gate polysilicon can be tailored so as to reduce array off-state leakage.

A yet further object of the present invention is to provide a method of manufacturing a gate conductor which can be easily implemented into existing DRAM processing techniques.

A still further object of the present invention is to provide a method wherein the charge storage characteristics from short channel lengths of the transfer device in the array region is improved.

An even further object of the present invention is to provide a method of manufacturing a merged logic DRAM device that is capable of forming relatively large transfer device gate lengths, without the limitations of gap fill considerations in the array device region, and proximity of the adjacent bordered contact in the support device regions; these considerations are problematic in prior art processing.

A yet further object of the present invention is to provide a method of manufacturing a merged logic DRAM device in which improved reliability of 'on' pitch devices is achieved without being limited by adjacent contacts.

These and other objects and advantages are achieved in the present invention by forming asymmetric gates in which prespacers are utilized in fabricating the same. Specifically, the inventive asymmetric gates are formed utilizing a method which comprises the steps of:

(a) providing a semiconductor structure including at least a gate oxide layer formed on a surface of a semiconductor substrate, said structure being divided into array device regions and support device regions which may have different oxide thicknesses;

(b) forming a gate stack on said structure, said gate stack including a layer of polysilicon formed on the gate oxide layer, a conductor material layer formed on said layer of polysilicon, and a nitride cap layer formed on said conductor material layer;

(c) partially mask open etching the gate stack by patterning the nitride cap layer and etching through the gate stack stopping on said layer of polysilicon;

(d) forming prespacers on exposed sidewalls of said partially etched gate stack;

(e) completing said mask open etching in said array device regions by etching any exposed polysilicon, while not etching said layer of polysilicon in the support device regions;

(f) performing a first oxidation step on the structure so as to form an oxide layer on exposed polysilicon sidewalls in said array device regions while simultaneously forming a sacrificial oxide layer on said layer of polysilicon in said support device regions;

(g) selectively removing said prespacers in said array and support device regions of said structure so as to provide patterned gate conductors, wherein said patterned gates in said array device regions include polysilicon step segments on each side thereof;

(h) selectively removing said sacrificial oxide layer and said layer of polysilicon in said support device regions;

(i) selectively trimming some of the polysilicon step segments provided in step (g) so as to obtain one or more patterned asymmetrical gates in said array device region, wherein each asymmetrical gate comprises a first edge having a substantially vertical sidewall extending to said gate oxide layer and a second edge having said polysilicon step segment; and (j) performing a second oxidization step on said structure so as to form oxide layers having variable thicknesses.

It should be noted that it is preferred in the present invention that the edges of the patterned gate conductors containing the substantially vertical sidewalls face each other so that a borderless bitline contact can be formed in that region of the structure.

In one embodiment of the present invention, a barrier layer is formed between the layer of polysilicon and conductor material layer. When a barrier layer is present, it may be optionally removed during one of the above mentioned etching steps, i.e., steps (c) or (e).

In another embodiment of the present invention, the structure in step (a) above further comprises core circuit device regions which are located between the array device regions and the support device regions. When a core circuit device region is present in the structure, both sides of the patterned gate conductors present therein will include a polysilicon step segment.

In accordance with another aspect of the present invention, an asymmetric field effect transistor (FET) is provided in which a first edge of said FET has a substantially vertical sidewall and a second edge has a polysilicon step segment.

A further aspect of the present invention relates to a memory device structure which includes:

an array device region, said array device region having one or more asymmetric gates, wherein each asymmetric gate comprises a first edge having a substantially vertical sidewall and a second edge having a polysilicon step segment; and a support device region, said support device region including one or more patterned gate conductors, wherein each patterned gate conductor includes edges having substantially vertical sidewalls.

Alternatively, the inventive structure may also include a core circuit device region located between the array device region and the support device region, said core circuit device region comprising one or more patterned gates, each patterned gate including a polysilicon step segment on each side of the gate.

It is noted that the asymmetric gates are provided in the present invention by utilizing the above mentioned prespacers. The use of the prespacers provides a FET which has reduced leakage current when turned 'off', yet the FET is capable of producing a adequate on-current. Thus, the on-current relative to the total off-state current is increased.

The use of the prespacers increases the channel length while moving the source/drain diffusion implants farther away from the conduction channel. This has a favorable effect in that the distance in dopant profile between channel and source/drain is less abrupt, thereby reducing the electric field at this junction, which in turn reduces leakage current.

The core circuits (wordline drivers, sense amplifiers, row decoders, etc) which are adjacent to the array device regions benefit from having the polysilicon step segments on both sides of the gate because the gates are laid out at a tight pitch. Use of the prespacers permits the required channel length for these transistors to be obtained, while the pitch between gate conductors is reduced. Reducing the pitch of these gate conductors helps match the gate conductors up better with the bitlines and wordlines which are wired to them from the array device region.

DETAILED DESCRIPTION OF THE INVENTION

Figure 1:
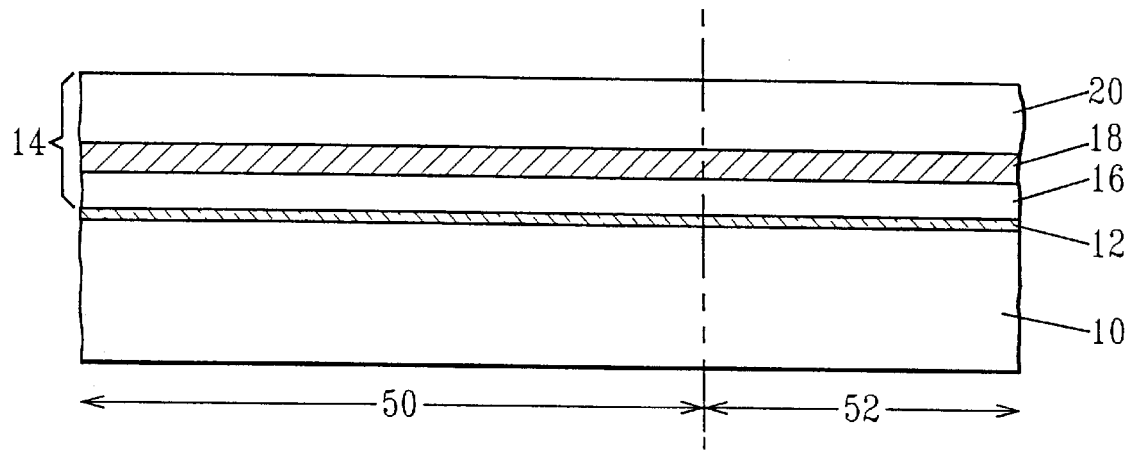
FIGS. 1–8 are pictorial views illustrating the basic processing steps of the present invention which are employed in forming asymmetric gates in array device regions of a memory structure.

The present invention will now be described in more detail by referring to the various drawings that accompany the present application. It should be noted that in the accompanying drawings like reference numerals are used for describing like and corresponding elements.

Reference is first made to FIG. 1 which illustrates a cross-sectional view of an initial structure that can be employed in the present invention. Specifically, the initial, structure shown in FIG. 1 comprises semiconductor substrate 10 having gate oxide layer (or layers) 12 formed thereon. In the drawings, the array device region is referenced by numeral 50, while the support device region is referenced by numeral 52. The array device region is those regions of the semiconductor wafer which have devices which benefit from longer channel lengths. Thus, the array device region typically contain the DRAM capacitors (and hence access transistors to the capacitors). These circuits operate at higher voltages than the support device regions which generally (but not always) operate at lower voltages and consist of higher performance transistors. Although the drawings of the present application depict only one of each region therein, the present invention works equally well when a plurality of said array device regions and said support device regions are present.

It is noted that the structure may also include a core circuit device region 54 (See, FIG. 9) therein which includes wordline drivers, sense amplifiers, decoders, etc. located between the array device regions and the support device regions. The core device region is more akin to the array device region in that it benefits from longer channels and can operate at higher voltages than the support device region.

FIG. 1 also shows the presence of gate stack 14 that is formed on an exposed surface of the gate oxide layer. As shown, the gate stack employed in the present invention includes at least a layer of polysilicon 16 formed on said gate oxide layer, conductor material layer 18 formed on said layer of polysilicon and nitride cap layer 20 formed on said conductor material layer.

The initial structure illustrated in FIG. 1 is composed of conventional materials that are well known to those skilled in the art and conventional processes, also well known to those skilled in the art, are used in fabricating the same. Specifically, semiconductor substrate 10 comprises any semiconducting material including, but not limited to: Si, Ge, SiGe, GaAs, InAs, InP and all other III/V semiconductor compounds. Layered substrates comprising the same or different semiconductor material, e.g., Si/SiGe, and silicon-on-insulators (SOIs) are also contemplated herein. The substrate may be of the n or p-type depending on the desired device to be fabricated. The substrate may contain active device regions, wiring regions, isolation regions or other like regions. For clarity, these regions are not shown in the drawings, but are nevertheless intended to be included within region 10.

Gate oxide layer 12 comprises a conventional oxide material such as $SiO_2$ which is formed on the surface of substrate 10 using a conventional thermal growing process, or alternatively, the gate oxide layer may be formed by a conventional deposition process such as chemical vapor deposition (CVD), plasma-assisted CVD, sputtering, evaporation and other like deposition processes. The thickness of the gate oxide layer may vary and is not critical to the present invention. Layer 12 may also constitute a high-k dielectric such as oxides of Ta, Zr, Al or combinations thereof, or may consist of siliconoxynitrides.

Polysilicon layer 16 which is a doped layer is formed on the surface of gate oxide layer 12 utilizing a conventional deposition process such as CVD or plasma-assisted CVD. Following deposition of the polysilicon layer, the deposited polysilicon is then doped with an appropriate dopant, or alternatively, an in-situ doping deposition process is employed in forming polysilicon layer 16. The thickness of the polysilicon layer may vary and is also not critical to the present invention. It is noted that polysilicon layer 16 is the gate polysilicon layer of the gate structure of the present invention.

An optional barrier layer (not shown in the drawings) may be formed on the polysilicon layer prior to forming the conductor material layer. The optional barrier layer is formed utilizing conventional deposition processes such as those mentioned above and the optional barrier layer may be composed of a material such as SiN, TaN, TaSiN, WN, $TaSi_2$ and other like materials that can prevent diffusion of a conductive material therethrough.

Conductor material layer 18 is formed on the layer of polysilicon utilizing a conventional deposition process such as CVD, plasma-assisted CVD, plating and evaporation. The conductor material layer employed in the present invention includes any material that is conductive. Illustrative examples include, but are not limited to: elemental metals such as W, Pt, Pd, Ru, Rh, and Ir; silicides and nitrides of these metals; and combinations thereof.

A highly preferred conductive material is $WSi_x$ (tungsten silicide) which is formed by depositing a layer of W and then a layer of polysilicon, annealing the structure to provide said $WSi_x$ layer and removing any remaining polysilicon that is not silicided utilizing a conventional wet etch process that is highly selective in removing polysilicon as compared to metal. That is, when the conductor material layer is composed of a metallic silicide, a conventional salicide process is used in forming the layer. Conventionally, the polysilicon and $WSi_x$ are deposited together in a CVD chamber.

The uppermost layer of the gate stack is nitride cap layer 20 which is formed utilizing a conventional deposition process such as CVD. The nitride cap is typically composed of a nitride material such as SiN and other like nitride-containing materials that prevent oxygen from diffusing into the structure. This layer may also be a deposited oxide such as TEOS. Note that an optional barrier made of a different dielectric than the nitride cap (say TEOS) may be deposited below the final nitride cap layer (this is not shown in the figures). This optional barrier may be used as an etch stop layer during the mask open process, as an etch stop layer for the subsequent prespacers etch as well as a barrier to the prespacers removal process.

The structure shown in FIG. 1 may be planarized after formation of each successive layer, or a single planarization process may be performed in providing the structure. If the incoming wafer is sufficiently planar, planarization of the gate stack is typically not needed.

Figure 2:
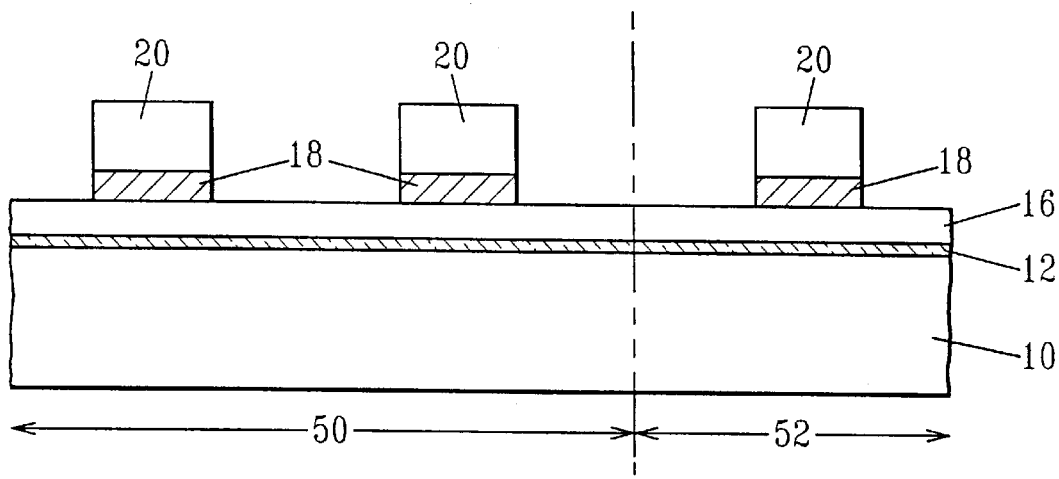

Next, as illustrated in FIG. 2, the gate stack is subjected to a partial mask open etching process wherein conventional lithography (including applying a photoresist, patterning the photoresist and developing the pattern) and etching (such as reactive-ion etching (RIE), ion-beam etching, plasma-etching and combinations thereof) are used in partially etching through the gate stack stopping on the layer of polysilicon.

Specifically, the partial mask open process employed in the present invention removes regions of the nitride cap and conductor material layers-which do not include a patterned photoresist thereon providing the partially etched gate conductor stack shown in FIG. 2 It is noted that in the subsequent drawings, any number of gates (i.e., patterned gate conductors) may be formed in each region of the structure; therefore the present invention is not limited to the number of gates depicted in the drawings.

Figure 3:
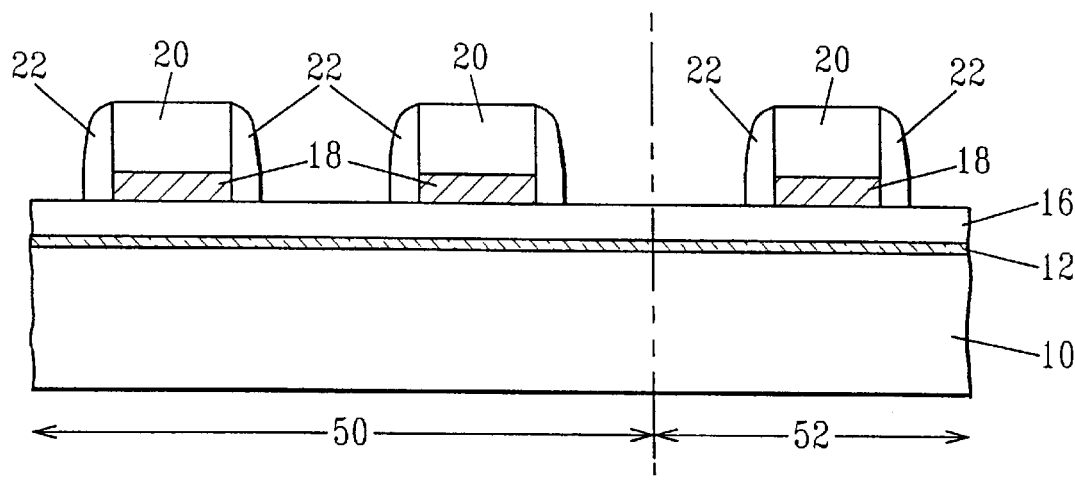

Next, prespacers 22 are formed on the exposed sidewalls of the partially etched gate conductor stack in both the array and support device regions (and, if present, the core circuit device regions) of the structure (See, FIG. 3). In one embodiment of the present invention, the prespacers are formed utilizing conventional deposition processes such as CVD and etching, i.e., RIE. In another embodiment of the present invention, the etching step is omitted and the deposited prespacers material is etched in a later processing step of the present invention, i.e., when the gate polysilicon layer is etched.

Notwithstanding which technique is employed in forming the prespacers, the prespacers are composed of a nitride-containing material which may be the same or different than the cap nitride layer or the optional barrier layer. The thickness of the prespacers is not critical to the present invention, but typically the spacers have a thickness of from about 5 to about 500 nm.

Figure 4:
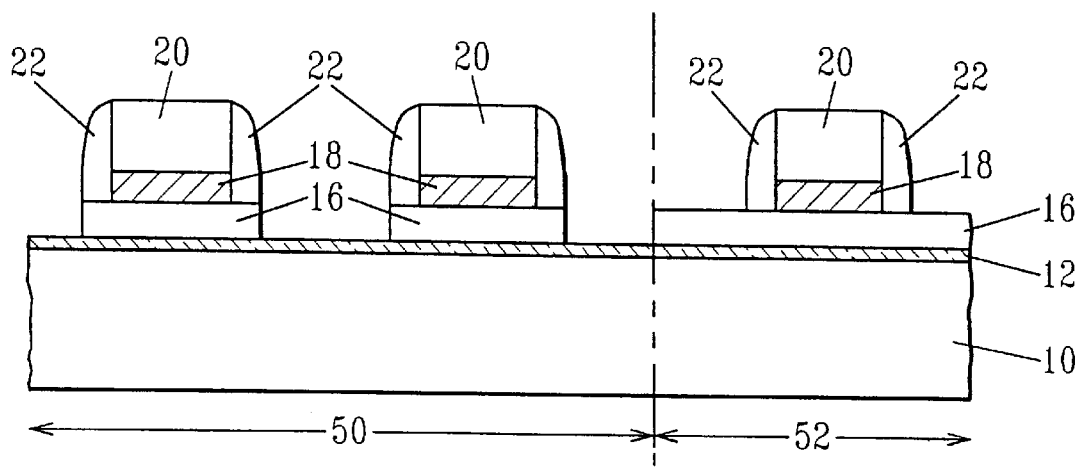

A conventional mask (not shown in the drawings) is then formed over the support device regions of the structure and the exposed layer of polysilicon is selectively etched in only the array device regions (or, if present, the core circuit device regions) to complete the etching of the gate conductor providing the structure shown in FIG. 4. The selective etch used in this point of the present invention includes the use of an anisotropic etching process such as reactive-ion etching (RIE) that is highly selective in removing polysilicon as compared to nitride-containing or oxide materials.

Following formation of the etched gate conductor in the array device regions (and, if present, the core circuit device regions) of the structure, the mask used in protecting the support device regions is removed from the structure utilizing a conventional stripping process.

The use of the prespacers permits the formation of larger gates in the array device regions (and, if present, the core circuit device regions) than the support device regions.

Figure 5:
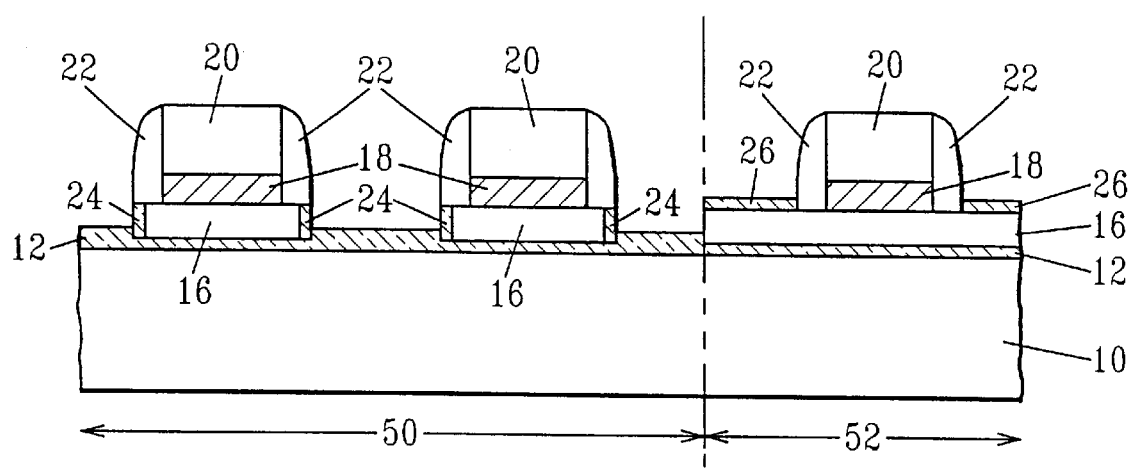

Next, as shown in FIG. 5, the structure is subjected to a first oxidation step so as to form oxide layer 24 on exposed sidewalls of any remaining polysilicon in said array device regions, while simultaneously forming a sacrificial oxide layer 26 in said support device regions. It should be noted that during the first oxidation step, a thin oxide layer forms on oxide layer 12 in the array device regions as well as on the sidewalls of the gate polysilicon layer. Thus, the oxide layer in the array device regions adjacent to the gate polysilicon, at this point of the inventive method, is thicker than the oxide in the support device regions and in regions under the gate polysilicon in the array device regions. The different thickness in the oxide layers is shown in FIG. 5.

The first oxidation step employed in the present invention is carried out at a temperature of greater than 850° C., preferably greater than 900° C., in an oxidizing ambient such as air, ozone or oxygen. A single temperature may be employed, or alternatively, a series of various ramp and soak cycles may also be used. The duration in which the first oxidation step is performed may vary depending on the desired thickness of the oxide/sacrificial oxide layers to be formed, but typically the oxidation step results in an oxide thickness of from about 3 to about 20 nm.

A conventional implant step may follow the first gate oxidation step of the present invention.

Following the first oxidation step of the present invention, prespacers 22 are then removed in all of the various device regions of the structure. Typically, the prespacers are made of SiN and are removed by an isotropic etch such as a Chemical Downstream Etch (CDE). It should be noted that in the array device regions (as well as the corresponding core circuit device regions) the patterned gate conductors include polysilicon step segment 25 on both sides of the patterned gate region (See, FIG. 6), the polysilicon step segment is however not present in the support device regions. The polysilicon step segment which also includes oxide region 24 is a result of utilizing the prespacers in the above described manner. It is emphasized that the term "polysilicon step segment" is used herein to denote polysilicon areas in which prespacers are formed and subsequently removed therefrom. The polysilicon step segment is thus an extension of the etched gate conductor that was not etched because of the presence of the prespacers.

Subsequently, a mask (not shown in the drawings) is formed in the array device regions (and, if present the core circuit device regions) and thereafter sacrificial oxide layer 26 is removed in the support device regions with known HF-based wet etchants. Exposed portions of polysilicon 16 in the support device regions are then etched selective to oxide and nitride providing the structure shown in FIG. 6. It is noted that the previous etched nitride cap provides an etch mask for use in this step of the present invention.

It is emphasized that at this point of the inventive method, the array device regions contain an oxide layer on the sidewalls of polysilicon layer 16. In contrast, the polysilicon layer of the gate conductor in the support device regions does not contain an oxide layer on the sidewalls; the only oxide present in the support device regions at this time of the process is the remaining gate oxide layer.

Figure 6:
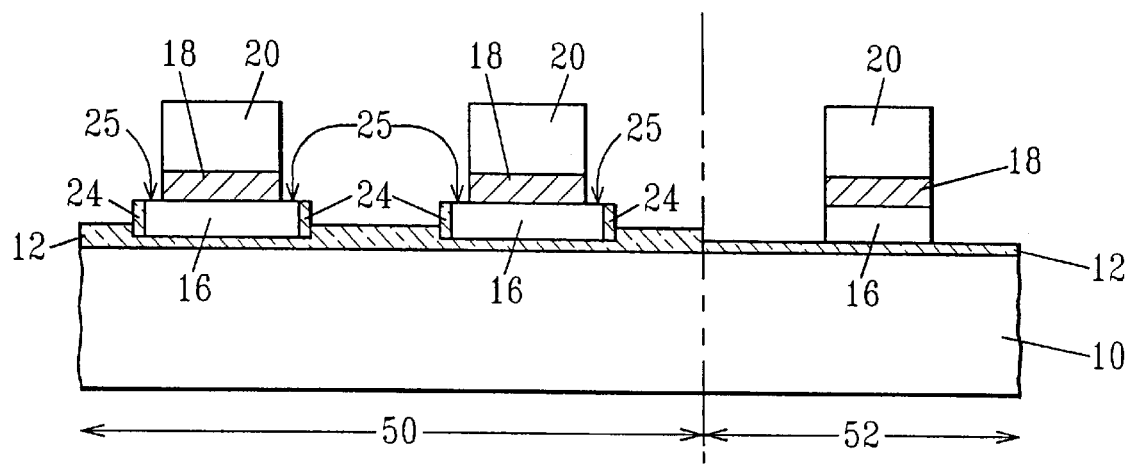
Figure 7:
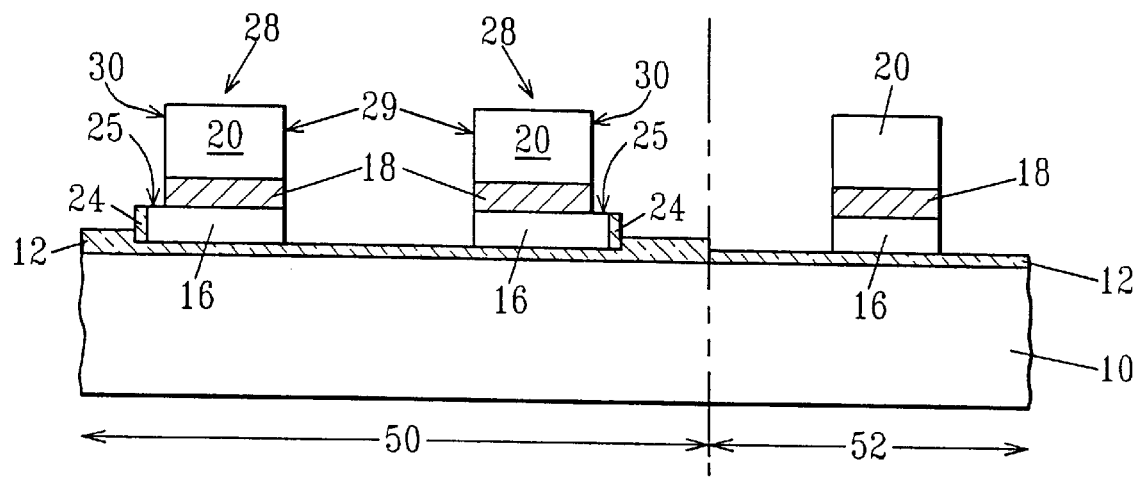

FIG. 7 illustrates the structure that is obtained after conducting a selective trimming step wherein some of the polysilicon step segments including oxide layer 24 shown in FIG. 6 are removed so as to obtain one or more patterned asymmetrical gates 28 in the array device regions, wherein each asymmetrical gate comprises a first edge 29 having a substantially vertical sidewall extending to gate oxide layer 12 and a second edge 30 having polysilicon step segment 25.

The trimming step employed in the present invention comprises a conventional lithography step and etching.

The lithography step includes applying a photoresist, patterning the photoresist, and developing the pattern. The etching steps includes any previously mentioned dry etching process such as RIE. It is noted that the patterned photoresist blocks the support device regions (as well as the core circuit device region) from this trim step.

Figure 8:
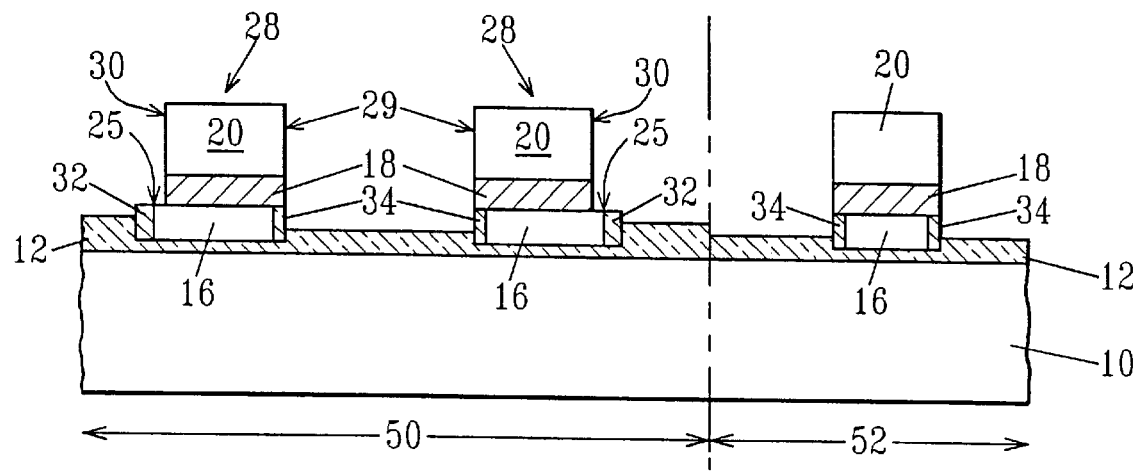

FIG. 8 illustrates the second oxidation step employed in the present invention wherein oxide layer 32 and oxide layer 34 are formed. The second oxidation step employed in the present invention is carried out at a temperature of greater than 850° C., preferably greater than 900° C., in an oxidizing ambient such as air, ozone or oxygen. A single temperature may be employed, or alternatively, a series of various ramp and soak cycles may also be used. The time in which the second oxidation step is performed may vary depending on the desired thickness of the oxide layer to be formed, but typically the oxidation step is carried out to grow an oxide having a thickness of from about 3 to about 10 nm.

In accordance with the present invention, oxide layer 32 has a greater thickness than oxide layer 34. This is attributed to the fact that oxide layer 32 includes oxide layers from both the first and second oxidation steps, whereas oxide layer 34 includes oxide only from the second oxidation step; the oxide formed in the first oxidation step, i.e., the sacrificial oxide layer, is removed in the present invention prior to conducting the second oxidation step and is thus not present in oxide layer 34.

Typically oxide layer 32 which is a combination of oxide layers formed from the first and second oxidation steps has a thickness of from about 5 to about 25 nm, whereas oxide layer 34 formed only from the second oxidation step has a thickness of from about 3 to about 10 nm.

Figure 9:
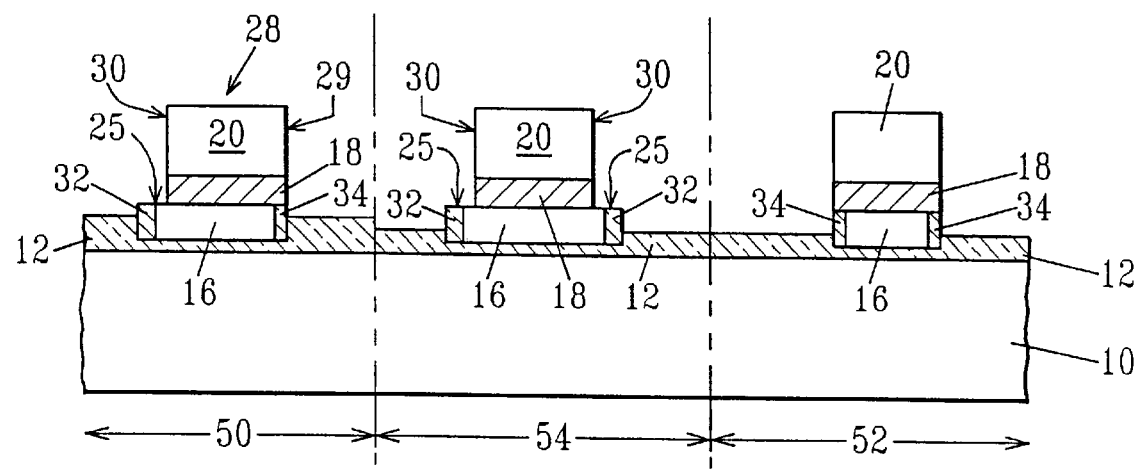
FIG. 9 is a pictorial view of an inventive structure which includes an array device region, a core circuit device region, and a support device region, each region including a different type of gate conductor therein

FIG. 9 illustrates an embodiment of the present invention wherein core circuit device region 54 is located between array device region 50 and support device region 52. The above mentioned processing steps are employed in fabricating the depicted structure, with the core circuit device regions undergoing etching of the gate conductor at the same time as the array device regions. No trimming occurs in the core circuit device regions; therefore the gates in those regions contain polysilicon step segments on both sides of the gates.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. An asymmetric field effect transistor (FET) comprising a patterned gate conductor located on a gate oxide, said patterned gate conductor having a first edge that has a substantially vertical sidewall which extends to the gate oxide and a second edge of having a lower polysilicon step segment located atop the gate oxide.

2. The asymmetric FET of claim 1 wherein said patterned gate conductor is present in an array device region.

3. The asymmetric FET of claim 1 wherein said patterned gate conductor comprises a conductor material layer and a polysilicon layer, wherein a surface portion of said polysilicon layer forms said step segment.

4. The asymmetric FET of claim 1 further comprising a nitride cap located atop said patterned gate conductor.

5. The asymmetric FET of claim 1 wherein said polysilicon step segment comprises a polysilicon layer having a first oxide region and a second oxide region, said first oxide region is thicker than said second oxide region.

6. The asymmetric FET of claim 5 wherein said first oxide region is located in said second edge containing said polysilicon step segment, and said second oxide region is located in said vertical edge.

7. A memory device structure comprising:
an array device region, said array device region having one or more asymmetric gates, wherein each asymmetric gate comprises a first edge having a substantially vertical sidewall and a second edge having a polysilicon step segment; and a support device region, said support device region including one or more patterned gate conductors, wherein each patterned gate conductor includes edges having substantially vertical sidewalls.

8. The structure of claim 7 further comprising a core circuit device region located between the array device region and the support device region, said core device region comprising one or more patterned gates, each gate including a polysilicon step segment on each side of the gate.

9. The memory device structure of claim 7 wherein each of said asymmetric gates comprises a conductor material layer and a polysilicon layer, wherein a portion of said polysilicon layer forms said step segment.

10. The memory device structure of claim 7 further comprising a nitride cap located atop each of said asymmetric gates.

11. The memory device structure of claim 7 further comprising a gate oxide present beneath each of said asymmetric gates.

12. The memory device structure of claim 7 wherein said polysilicon step segment comprises a polysilicon layer having a first oxide region and a second oxide region, said first oxide region is thicker than said second oxide region.

13. The memory device structure of claim 12 wherein said first oxide region is located in said second edge containing said polysilicon step segment, and said second oxide region in located in said vertical edge.

* * * * *